United States Patent
Pecora

(10) Patent No.: US 7,060,629 B2
(45) Date of Patent: *Jun. 13, 2006

(54) ETCH OF SILICON NITRIDE SELECTIVE TO SILICON AND SILICON DIOXIDE USEFUL DURING THE FORMATION OF A SEMICONDUCTOR DEVICE

(76) Inventor: David S. Pecora, 4401 S. Falconrest, Boise, ID (US) 83706

( * ) Notice: Subject to any disclaimer, the term of this patent is extended or adjusted under 35 U.S.C. 154(b) by 107 days.

This patent is subject to a terminal disclaimer.

(21) Appl. No.: 10/819,517

(22) Filed: Apr. 7, 2004

(65) Prior Publication Data

US 2004/0192054 A1    Sep. 30, 2004

Related U.S. Application Data

(63) Continuation of application No. 09/854,206, filed on May 11, 2001, now Pat. No. 6,716,759.

(51) Int. Cl.
*H01L 21/302*  (2006.01)

(52) U.S. Cl. ............... 438/719; 438/724; 438/743; 438/744

(58) Field of Classification Search .......... 438/719, 438/723, 724, 743, 744
See application file for complete search history.

(56) References Cited

U.S. PATENT DOCUMENTS

| | | | |
|---|---|---|---|
| 5,429,070 A | 7/1995 | Campbell et al. | 118/723 R |
| 5,580,821 A | 12/1996 | Mathews et al. | 438/654 |
| 5,626,716 A | 5/1997 | Bosch et al. | 438/723 |
| 5,851,887 A * | 12/1998 | Caldwell et al. | 438/295 |
| 5,872,045 A | 2/1999 | Lou et al. | 438/432 |
| 5,877,073 A | 3/1999 | Mao et al. | 438/585 |
| 5,994,227 A | 11/1999 | Matsuo et al. | 438/696 |
| 6,046,088 A | 4/2000 | Klein et al. | 438/296 |
| 6,162,583 A | 12/2000 | Yang et al. | 430/313 |
| 6,337,262 B1 | 1/2002 | Pradeep et al. | 438/574 |
| 6,716,759 B1 * | 4/2004 | Pecora | 438/706 |

FOREIGN PATENT DOCUMENTS

EP    0 945 896 A1    9/1999

OTHER PUBLICATIONS

"Highly Selective Etching of Silicon Nitride Over Silicon and Silicon Dioxide", J. Vac. Sci. Technol. A 17(6), Nov./Dec. 1999, pp. 3179-3184.

* cited by examiner

*Primary Examiner*—Nadine G. Norton
*Assistant Examiner*—Binh X. Tran
(74) *Attorney, Agent, or Firm*—Kevin D. Martin

(57) ABSTRACT

A method for etching silicon nitride selective to silicon dioxide and silicon (polycrystalline silicon or monocrystalline silicon) comprises the use of oxygen along with an additional etchant of either $CHF_3$ or $CH_2F_2$. Flow rates, power, and pressure settings are specified.

10 Claims, 1 Drawing Sheet

ETCH OF SILICON NITRIDE SELECTIVE TO SILICON AND SILICON DIOXIDE USEFUL DURING THE FORMATION OF A SEMICONDUCTOR DEVICE

This is a continuation of U.S. Ser. No. 09/854,206 filed May 11, 2001 and issued Apr. 6, 2004 as U.S. Pat. No. 6,716,759.

FIELD OF THE INVENTION

This invention relates to the field of semiconductor manufacture and, more particularly, to an etch useful for removing silicon nitride selective to silicon and silicon dioxide.

BACKGROUND OF THE INVENTION

During the manufacture of semiconductor devices such as a memory devices, logic devices, and microprocessors, various processes are commonly performed. Etching silicon nitride selective to silicon (such as polysilicon) and to silicon dioxide with various etch ratios is often required. For example, hot phosphoric acid isotropically etches silicon nitride selective to silicon dioxide and silicon. Other processes for etching $Si_3N_4$ selective to $SiO_2$ and Si are discussed in "Highly Selective Etching of Silicon Nitride Over Silicon and Silicon Dioxide," *J. Vac. Sci. Technol.* A 17(6), November/December 1999, which describes the use of oxygen ($O_2$) and nitrogen ($N_2$) in combination with $CF_4$ or $NF_3$. The processes discussed achieve $Si_3N_4$ to Si and to $SiO_2$ etch rate ratios of up to 100 and 70 respectively using nitrogen trifluoride. The processes use high flow rates of 800 standard cubic centimeters (sccm) $O_2$ and 110 sccm $N_2$ for most experiments. Further, using carbon tetrafluoride, a $Si_3N_4$ to polysilicon etch ratio of 40 was achieved while $SiO_2$ was not etched at all. Etch rates of silicon nitride are below about 50 angstroms (Å) per minute.

As semiconductor manufacture typically requires high volume processing to lower costs, any decrease in temporal processing requirements can result in a large increase in product throughput. Further, having options available to accomplish a task such as etching silicon nitride is advantageous, as one process may function better for certain manufacturing flows. Additional methods for etching silicon nitride selective to silicon and silicon nitride at an accelerated rate would be desirable.

SUMMARY OF THE INVENTION

The present invention provides a new etch method which, among other advantages, reduces problems associated with the manufacture of semiconductor devices, particularly problems in etching silicon nitride selective to silicon and silicon dioxide. In accordance with one embodiment of the invention a semiconductor wafer substrate assembly having a layer of silicon nitride and a layer of at least one of silicon and silicon dioxide is placed into an etch chamber. Oxygen and either $CHF_3$ or $CH_2F_2$ are introduced into an etch chamber under controlled flow rates, power, and pressure. At the parameters detailed herein, the etch removes silicon nitride selective to silicon dioxide and silicon.

Additional advantages will become apparent to those skilled in the art from the following detailed description read in conjunction with the appended claims and the drawings attached hereto.

Figure 1:
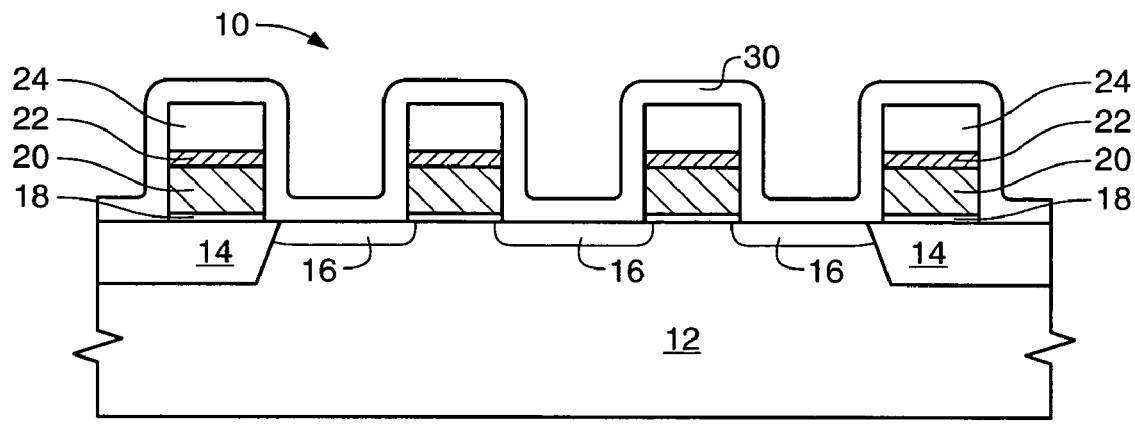
FIG. 1 depicts a cross section of a semiconductor wafer assembly including a blanket layer of silicon nitride.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A silicon nitride etch selective to silicon (such as monocrystalline or polycrystalline silicon) and to silicon dioxide comprises the use of $O_2$ and either $CHF_3$ or $CH_2F_2$ at relatively low flow rates. It should be noted that the parameters described herein are optimized for an Applied Materials 5000 (AME5000) etcher, but they may be converted easily by one of ordinary skill in the art for other systems.

In accordance with one embodiment of the invention, a semiconductor wafer having a layer of silicon nitride and a layer of silicon dioxide and/or silicon is placed into an etch chamber and subjected to an etch. This embodiment of the etch comprises an $O_2$:$CHF_3$ or $O_2$:$CH_2F_2$ flow rate ratio of greater than about 3:1, which results in a relatively rapid, controllable $Si_3N_4$ etch rate with good selectivity to Si and to $SiO_2$. For example, an $O_2$ flow rate of between about 20 sccm and about 80 sccm and a $CHF_3$ or $CH_2F_2$ flow of between about 5 sccm arid about 25 sccm would be sufficient. More preferably, an $O_2$ flow rate of between about 35 sccm and about 60 sccm and a $CHF_3$ or $CH_2F_2$ flow of between about 10 sccm and about 20 sccm would be sufficient, and most preferably an $O_2$ flow rate of about 60 sccm and a $CHF_3$ or $CH_2F_2$ flow of about 20 sccm would be sufficient.

During the etch, a pressure of between about 10 millitorr to about 60 millitorr is maintained. More preferably, a pressure of between about 30 to about 60 millitorr, and most preferably, between about 30 to about 40 millitorr is maintained. Further, a power of between about 300 watts to about 600 watts, more preferably between about 300 watts to about 500 watts, and most preferably between about 300 to about 400 watts sustained within the chamber. With increasing power and/or pressure the etch rate increases and the selectivity to Si and $SiO_2$ decreases.

Using the parameters described above, it is estimated that an $Si_3N_4$:$SiO_2$ etch ratio of up to about 1.3:1 on a blanket film and up to about 3:1 over topography can be achieved, as well as an $Si_3N_4$:Si etch ratio of up to about 7:1. As the $O_2$:$CHF_3$ or $O_2$:$CH_2F_2$ increases beyond 3:1 the etch rate of the $Si_3N_4$ decreases and the selectivity to Si and $SiO_2$ increases. With a high $O_2$:$CHF_3$ or $O_2$:$CH_2F_2$ ratio, above about 10:1, the etch rate becomes so slow as to be decreasing usefulness in most instances. As the $O_2$:$CHF_3$ or $O_2$:$CH_2F_2$ ratio decreases further below 3:1 the etch removes $Si_3N_4$ at an increased rate but also becomes less selective to Si and $SiO_2$. An $O_2$:$CHF_3$ or $O_2$:$CH_2F_2$ ratio of about 3:1 is believed to provide a good balance between nitride etch rate and selectivity to Si and $SiO_2$ in many uses of the invention for semiconductor manufacture.

At a pressure of about 30 millitorr, a power of 300 watts, a $CHF_3$ or $CH_2F_2$ flow rate of 20 sccm, and an $O_2$ flow rate of 60, the etch rate of $Si_3N_4$ will be about 420 Å/min. With a pressure of 40 millitorr, a pressure of about 40 millitorr, a power of 300 watts, a $CHF_3$ or $CH_2F_2$ flow rate of about 10 sccm and an $O_2$ flow rate of about 40 sccm, the etch rate increases to about 904 Å/min. As the $CHF_3/O_2$ or $CH_2F_2/O_2$ ratio increases the $Si_3N_4$ etch rate increases, such that at a pressure of 30 millitorr and a power of 300 watts, and a flow rate of 35 sccm for both $O_2$ and $CHF_3$ or $CH_2F_2$ the etch rate increases to about 1270 Å/min. These processes use a chuck temperature of about 10° C. and a sidewall temperature of about 20° C.

Figure 2:
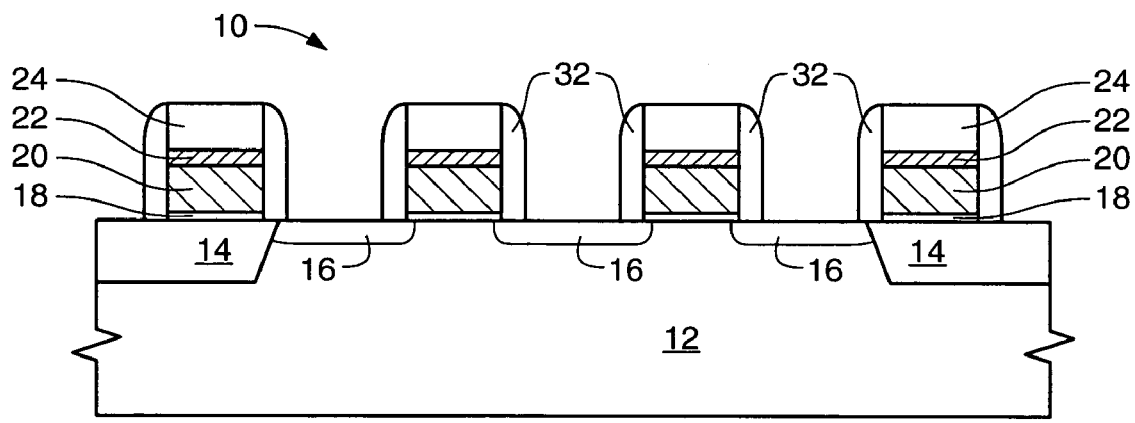
FIG. 2 depicts the cross section of FIG. 1 subsequent to an etch to form silicon nitride spacers.

Using the preferred parameters of the instant invention as discussed above results in an anisotropic nitride etch which removes nitride from horizontal surfaces faster than it removes nitride from vertical surfaces at an etch ratio of about 3.7:1. This is especially useful for etching structures similar to those depicted in FIGS. 1 and 2, as it allows sufficient etching to remove the nitride layer from the wafer surface without damaging the silicon wafer. The structure of FIG. 1 depicts a semiconductor substrate assembly 10 comprising a semiconductor wafer 12, field oxide 14, doped transistor source/drain regions 16 within the wafer 12, and a transistor gate stack comprising gate oxide 18, polycrystalline silicon (polysilicon) 20, a conductive silicide layer 22, and an oxide or nitride layer 24, for example tetraethyl orthosilicate (TEOS) or silicon nitride. FIG. 1 further depicts a blanket silicon nitride layer between about 300 Å about 600 Å thick. Such a structure can be manufactured by one of ordinary skill in the art.

The structure of FIG. 1 is subjected to an inventive etch as described above. An exemplary etch includes processing the wafer in a chamber of an AME5000 etch chamber. After placing the wafer substrate assembly in the etch chamber, $O_2$ and $CHF_3$ or $CH_2F_2$ are introduced into the chamber at flow rates of about 60 sccm and about 20 sccm respectively. Pressure is maintained at between about 30 millitorr and about 40 millitorr, and a power of between about 300 watts and about 400 watts is utilized. At a chuck temperature of about 10° C. and a sidewall temperature of about 20° C., the silicon nitride will etch at a rate of about 720 Å/min in the vertical direction, and about 180 Å/min in the horizontal direction. Generally, the vertical:horizontal etch rate will be about 4:1. For the 525 Å thick layer of silicon nitride depicted in FIG. 1, the etch is performed for between about 35 seconds and about 60 seconds which results in the structure of FIG. 2. Spacers 32 having a width of about 300 Å to about 400 Å are formed.

The etch detailed above provides a silicon nitride etch which is selective to silicon and silicon dioxide. This is accomplished using the etch as described consisting essentially of a flow of $O_2$ and $CHF_3$ or $CH_2F_2$. The addition of hydrogen from $CHF_3$ or from $CH_2F_2$, in addition to providing an etch of silicon nitride selective to silicon and silicon dioxide, further provides an etch which results in a more square profile of the completed transistor structures than conventional etches. The relatively low flow rates of $CHF_3$ or $CH_2F_2$ may also contribute to the less rounded feature profile compared with conventional etches having high gas flow rates. Rounded profiles may adversely affect the self-aligned contact (SAC) etch performance, and possibly affect the electrical properties of the device. In extreme cases, conventional etches can expose the conductive polysilicon, metal, or silicide which is protected by the oxide. Additionally, the structure depicted in FIG. 1, and other similar structures, can be etched with less concern for damaging the silicon wafer once the nitride has been cleared due to the high selectivity to silicon.

A semiconductor device formed in accordance with the invention may be attached along with other devices to a printed circuit board, for example to a computer motherboard or as a part of a memory module used in a personal computer, a minicomputer, or a mainframe. A device formed in accordance with the invention could further be useful in other electronic devices related to telecommunications, the automobile industry, semiconductor test and manufacturing equipment, consumer electronics, and virtually any consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method of fabricating silicon nitride features on an integrated circuit device comprising:
   providing a semiconductor substrate assembly comprising:
     first and second vertically-oriented integrated circuit structures, each having a horizontally-oriented surface and a vertically-oriented surface, wherein the first and second integrated circuit structures are horizontally spaced from each other; and
     a horizontally-oriented base surface interposed between the first and second integrated circuit structures;
   forming a layer of silicon nitride over the horizontally-oriented surfaces and over the vertically-oriented surfaces of the first and second integrated circuit structures such that the horizontally-oriented and vertically-oriented surfaces of first and second integrated circuit structures and the horizontally-oriented base surface between the integrated circuit structures are covered with the layer of silicon nitride; and
   anisotropically etching the layer of silicon nitride over the horizontally-oriented surfaces of the first and second integrated circuit structures and over the horizontally-oriented base surface with an etchant consisting essentially of oxygen and $CHF_3$, such that the flow rates of oxygen and $CHF_3$ have a ratio of about three to one (3:1) and provide a vertical to horizontal etch rate of about 3.7:1 to result in silicon nitride features on the vertically-oriented surfaces of the first and second integrated circuit structures.

2. The method of claim 1 wherein the anisotropic etch further comprises oxygen at a flow rate of between about 20 sccm to about 80 sccm and $CHF_3$ at a flow rate of between about 5 sccm to about 25 sccm.

3. The method of claim 1 wherein at least a portion of the vertically-oriented surface of the first and second integrated circuit structures consists essentially of polysilicon.

4. The method of claim 1 wherein the horizontally-oriented surface of the first and second integrated circuit structures consists essentially of silicon dioxide.

5. The method of claim 1 further comprising, during the step of providing the semiconductor substrate assembly:
   forming a layer of polysilicon;
   forming a layer of silicon dioxide over the layer of polysilicon; and etching the layer of polysilicon and the layer of silicon dioxide to form at least a portion of the first and second vertically-oriented integrated circuit structures.

6. A method of fabricating silicon nitride features on an integrated circuit device comprising:

providing a semiconductor substrate assembly comprising:

first and second vertically-oriented integrated circuit structures, each having a horizontally-oriented surface and a vertically-oriented surface, wherein the first and second integrated circuit structures are horizontally spaced from each other; and a horizontally-oriented base surface interposed between the first and second integrated circuit structures;

forming a layer of silicon nitride over the horizontally-oriented surfaces and the vertically-oriented surfaces of each of the first and second integrated circuit structures such that the horizontally-oriented surfaces and the vertically-oriented surfaces of first and second integrated circuit structures and the horizontally-oriented base surface between the integrated circuit structures are covered with the layer of silicon nitride; and anisotropically etching the layer of silicon nitride over the horizontally-oriented surfaces of the first and second integrated circuit structures and over the horizontally-oriented base surface with an etchant consisting essentially of oxygen and $CH_2F_2$, such that the flow rates of oxygen to $CH_2F_2$ have a ratio of about three to one (3:1) and provide a vertical to horizontal etch rate of about 3.7:1 to result in silicon nitride features on the vertically-oriented surfaces of the first and second integrated circuit structures.

7. The method of claim 6 wherein the anisotropic etch further comprises oxygen at a flow rate of between about 20 sccm to about 80 sccm and $CH_2F_2$ at a flow rate of between about 5 sccm to about 25 sccm.

8. The method of claim 6 wherein at least a portion of the vertically-oriented surface of the first and second integrated circuit structures consists essentially of polysilicon.

9. The method of claim 6 wherein the horizontally-oriented surface of the first and second integrated circuit structures consists essentially of silicon dioxide.

10. The method of claim 6 further comprising, during the step of providing the semiconductor substrate assembly:

forming a layer of polysilicon;

forming a layer of silicon dioxide over the layer of polysilicon; and etching the layer of polysilicon and the layer of silicon dioxide to form at least a portion of the first and second vertically-oriented integrated circuit structures.

* * * * *

UNITED STATES PATENT AND TRADEMARK OFFICE
CERTIFICATE OF CORRECTION

PATENT NO. : 7,060,629 B2  Page 1 of 1
APPLICATION NO. : 10/819517
DATED : June 13, 2006
INVENTOR(S) : David S. Pecora It is certified that error appears in the above-identified patent and that said Letters Patent is hereby corrected as shown below:

On the title page, replace the filing date item [22] with -- April 6, 2004 --.

Signed and Sealed this

Twenty-eighth Day of November, 2006

JON W. DUDAS
*Director of the United States Patent and Trademark Office*